United States Patent [19]

Brienza et al.

[11] 4,338,518

[45] Jul. 6, 1982

[54] POSITION ENCODER WITH COLUMN SCANNING AND ROW SENSING

[75] Inventors: Michael J. Brienza, Ridgewood; Richard C. Warner, Morris Plains, both of N.J.

[73] Assignee: The Singer Company, Stamford, Conn.

[21] Appl. No.: 186,822

[22] Filed: Sep. 12, 1980

[51] Int. Cl.³ .............................................. H01J 3/14
[52] U.S. Cl. .......................... 250/237 G; 250/231 SE
[58] Field of Search ............ 250/231 SE, 237 G, 229, 250/578, 227; 356/395, 396; 340/347 P, 365 P

[56] References Cited

U.S. PATENT DOCUMENTS

| | | | |
|---|---|---|---|
| 3,481,042 | 12/1969 | Lemelson | 33/174 |
| 3,553,466 | 6/1971 | Johnston | 250/237 G |
| 3,573,471 | 4/1971 | Kolb | 250/227 |
| 3,634,848 | 1/1972 | Prunk et al. | 340/324 |
| 3,636,635 | 1/1972 | Lemelson | 33/174 L |
| 3,748,043 | 7/1973 | Zipin | 250/237 G |
| 3,824,587 | 7/1974 | Fowler | 340/347 P |
| 3,975,633 | 8/1976 | Larkin | 250/227 |
| 4,011,448 | 3/1977 | Hordeski | 250/237 R |
| 4,047,025 | 9/1977 | Lemelson | 340/347 P |
| 4,291,976 | 9/1981 | McMahon | 340/347 P |

*Primary Examiner*—David C. Nelms
*Attorney, Agent, or Firm*—David L. Davis; Robert E. Smith; Edward L. Bell

[57] ABSTRACT

An optical encoding arrangement for determining the position of a movable member is provided with an optically masked light transmitting coding element interposed between a light emitting array and a light detecting array so that the light detecting elements in the array are selectively energized in accordance with the position being measured. In particular, the encoder provides for transmission, by optical means, of a series of digital bytes of predetermined length, in a bit parallel byte serial format, with the successive bytes later being assembled into a usable data format.

4 Claims, 6 Drawing Figures

POSITION ENCODER WITH COLUMN SCANNING AND ROW SENSING

BACKGROUND OF THE INVENTION

This invention relates to position encoders of the type utilizing energy emitters and receptors with a position coded mask interposed in the transmission paths between the emitters and receptors.

Position encoders are well known in the prior art for providing an indication of the position of a movable element. In one class of encoders known as absolute angle encoders, a rotatable code element such as a disc has a plurality of sensible codes arranged therearound, these codes being read by an associated sensor to provide an output indication of the angular position of the code element about its rotational axis. The particular codes employed can take a variety of forms to suit particular operating requirements, and can include optically, magnetically or electrically sensible coding arrangements which are per se well known in the art. In such prior art arrangements, the codes are typically arranged along a plurality of tracks, with the tracks being sensed in a parallel fashion. Thus, the prior art has typically required one sensor per track. A disadvantage with such an arrangement is the cost involved with the sensors.

It is therefore an object of this invention to provide a position encoder with an efficient utilization of sensing elements.

SUMMARY OF THE INVENTION

The foregoing and additional objects are attained in accordance with the principles of this invention by providing a position encoder comprising a coding member defining a predetermined path and having coded indicia at a plurality of discrete positions along the path, the indicium at each of the positions comprising a rectangular array of code elements forming a first plurality of columns and a second plurality of rows, a member movable relative to the coding member to any of the plurality of discrete positions, interrogation means for sequentially scanning column by column the code elements at the position occupied by the movable member, sensing means associated with the rows of the code element array and operative in synchronism with the interrogation means for providing in sequence parallel groups of encoding signals, each group corresponding to a column scan of the code element by the interrogation means, and means for assembling a usable data format from the parallel groups of encoding signals.

DESCRIPTION OF THE DRAWINGS

The foregoing will be more readily apparent upon reading the following description in conjunction with the drawings wherein.

DETAILED DESCRIPTION

Figure 1:
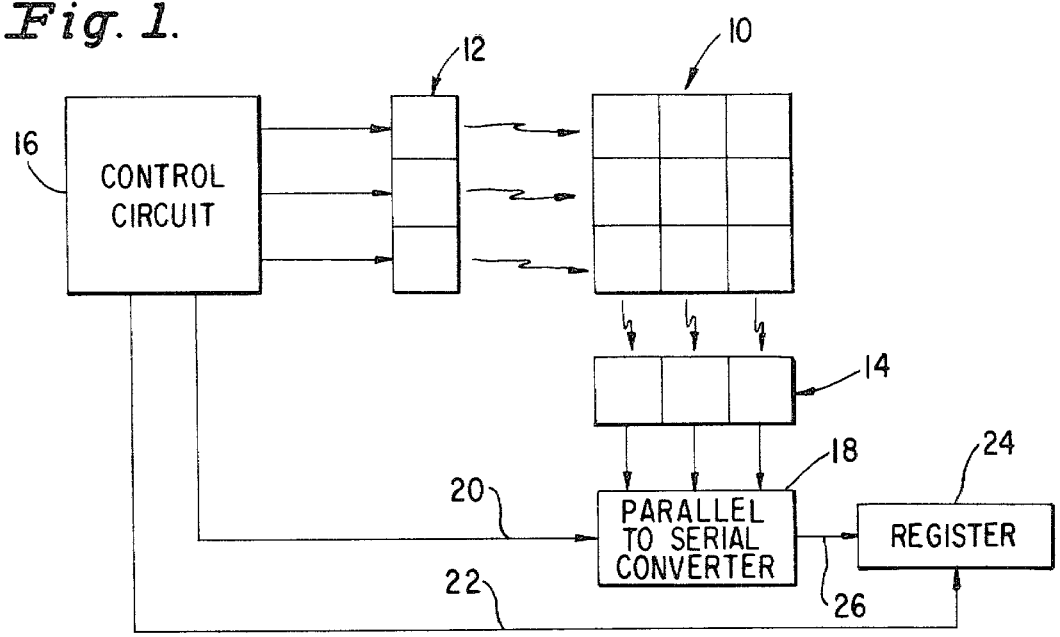
FIG. 1 is a general block diagram of an encoding arrangement constructed in accordance with the principles of this invention.

Referring now to the drawings, wherein like elements in different figures thereof have the same reference character applied thereto, FIG. 1 shows a block schematic diagram useful in understanding the operation of the present invention. For illustrative purposes, the position encoder will be considered as an optical system, although it is understood that, with minor modifications, other than an optical system may be utilized without departing from the spirit and scope of this invention.

In accordance with the principles of this invention, there is provided a coding member defining a predetermined path having a plurality of discrete positions. At each of the positions along the path the coding member has a rectangular array of code elements. In the case of an optical encoder, the code elements would be areas of the coding member which are selectively opaque or transmissive in a predetermined manner in accordance with a defined binary position code.

FIG. 1 illustrates the operation of the encoding system according to the present invention at an arbitrary position. At that position, the coding member includes a rectangular array 10 of code elements forming a first plurality of columns and a second plurality of rows. For purposes of illustration, there are three columns and three rows in the array 10. (It is understood that the rows and columns may be interchanged without departing from the spirit of this invention.) The individual elements in the array 10 are selectively either light transmissive or opaque in accordance with a defined binary position code. Since there are nine elements in the three by three array 10, there is the potential for encoding $2^9$ positions, using a binary code. In accordance with the principles of this invention, there is provided an array of three light emitting elements 12, each of which is associated with a row of the coding member array 10. There is also provided an array of three light receiving and sensing elements 14, each of which is associated with a column of the coding member array 10. In operation, the control circuit 16 causes the light emitting elements in the array 12 to be energized one by one so as to sequentially scan row by row the coding member array 10. Thus, the light receiving and sensing array 14 is provided with an indication of the code stored in the coding member array 10 a row at a time. The output of the light receiving and sensing array 14 is applied to a parallel to serial converter 18 which operates in accordance with control signals received over the lead 20 from the control circuit 16. The control circuit 16 also applies control signals over the lead 22 to a register 24 which receives as its input over the lead 26 in a serial manner the code bits of the array 10 from the parallel to serial converter 18. Although a parallel to serial converter 18 in conjunction with a register 24 has been shown, this invention is not intended to be limited to this particular configuration of elements but rather is intended to be used with any suitable means for assembling a usable data format from the parallel groups of encoding signals provided by the light receiving and sensing array 14.

Figure 2:
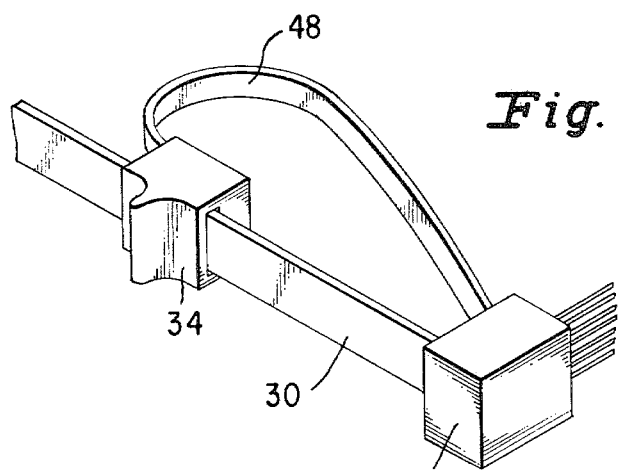
FIG. 2 is a perspective view of one side of an illustrative construction of a linear position encoder constructed in accordance with the principles of this invention.
Figure 3:
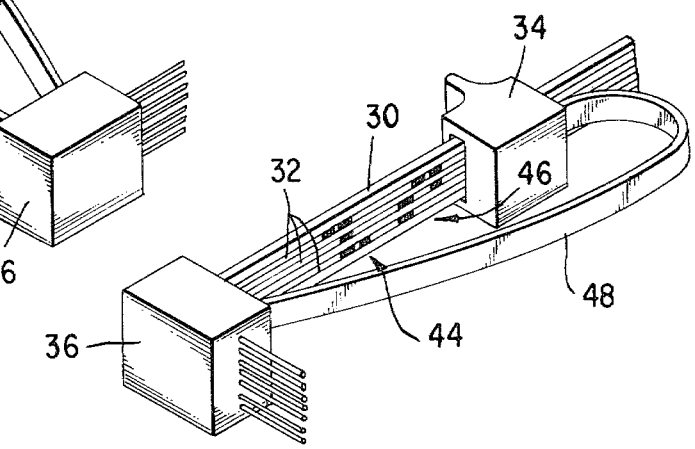
FIG. 3 is a perspective view of a second side of the embodiment shown in FIG. 2.
Figure 4:
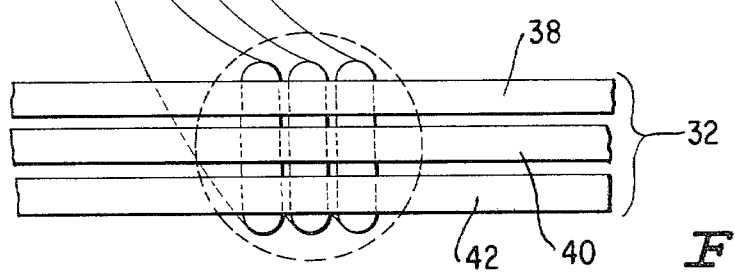
FIG. 4 is an enlarged view of a portion of the embodiment of FIGS. 2 and 3.

FIGS. 2, 3 and 4 are views of an illustrative construction of a linear position encoder utilizing optical techniques according to this invention. Illustratively, a guide bar 30 supports a coding member 32 which defines a predetermined path for a movable member 34. The member 34 illustratively is a slider and cooperates with detents on the bar 30 so that it is movable to a plurality of discrete positions along the bar 30. The coding member 32 is formed of a plurality, illustratively 3, of optical fibers 38, 40 and 42 terminating in an optoelectronic package 36. The coding member 32 is provided with coded indicia at each of the plurality of discrete detented positions along the guide bar 30. These coded indicia illustratively take the form of selectively masked areas on the optical fibers 38, 40 and 42. Two of these areas of coded indicia 44 and 46 are illustrated in FIG. 3 as selectively masked rectangular three by three arrays.

The slider 34 is coupled to the optoelectronic package 36 via a flexible cable 48 which may consist of either electrical conductors or optical fibers on a suitable ribbon carrier. The determination as to whether the flexible cable 48 consists of electrical conductors or optical fibers is determined by whether or not light emitting elements are provided in the slider 34 or the optoelectronic package 36, respectively. In any event, within the slider 34, light transmitting optical fibers 50, 52 and 54 are arranged at their output ends to each extend over all three of the fibers 38, 40 and 42, as shown in FIG. 4, so that the intersections between the fibers 50, 52 and 54, and the fibers 38, 40 and 42 form a rectangular three by three array. At each of the intersection points, the area thereof is selectively masked in accordance with a predetermined binary position code. Accordingly, as shown in FIG. 4, there are nine areas of intersection between the vertically oriented emitter fibers 50, 52 and 54 and the horizontally arranged receiving fibers 38, 40 and 42. These nine areas are each assigned a binary value, ranging from $2^0$ to $2^8$. Thus, each intersection area can be viewed as a separate element of a nine bit binary number with possible values ranging from zero to 511. Accordingly, the emitting fibers 50, 52 and 54 will transmit light to the receiving fibers 38, 40 and 42 unless the intersection areas are masked. This light will travel down the fibers 38, 40 and 42 to the optoelectronics package 36 where it will be converted into electrical signals.

Figure 5:
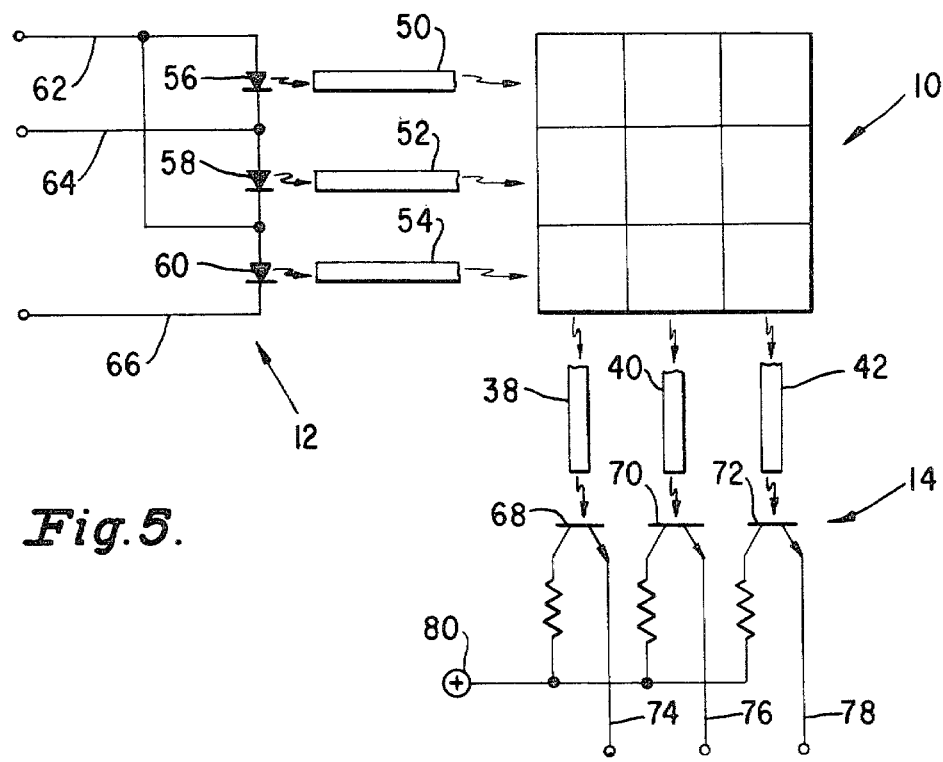
FIG. 5 is a schematic circuit diagram illustrating the operation of the emitting and receiving elements of the embodiment shows in FIGS. 2, 3 and 4.

The operation will now be described with reference to FIG. 5 wherein there is shown three light emitters, illustratively light emitting diodes (LED's) 56, 58 and 60 each associated with a respective fiber 50, 52 and 54. The LED's 56, 58 and 60 may physically be in either the slider 34 or the optoelectronics package 36. In any event, the LED's 56, 58 and 60 are connected via the leads 62, 64 and 66 to the control circuit 16 (FIG. 1) and when appropriate voltages are selectively applied to the leads 62, 64 and 66, the LED's 56, 58 and 60 are sequentially energized, in a manner well known in the art. The sequential energization of the LED's 56, 58 and 60 causes the array 10 to be interrogated as to its coded value by sequentially scanning row by row (or column by column) the code assigned to the position occupied by the slider 34. This code is sensed by connecting the receiving fibers 38, 40 and 42 each to a respective photosensitive element, illustratively the phototransistors 68, 70 and 72, which are within the optoelectronics package 36. The phototransistors 68, 70 and 72 are coupled via the leads 74, 76 and 78 to the parallel to serial converter 18 (FIG. 1). Thus, when the LED 56 is energized by applying a high voltage to the lead 62 and a low voltage to the lead 64, light emitted by the LED 56 travels through the optical fiber 50 and impinges on the top row of the array 10. The areas of the array 10 which are not masked will transmit this light to the respective fibers 38, 40 and 42 which will cause the respective phototransistors 68, 70 and 72 to become conductive and apply current from the source 80 to the respective leads 74, 76 and 78. Thus, a three bit binary code is generated. Next, the LED 58 is energized which will cause a three bit code corresponding to the masked areas of the middle row of the array 10 to be generated. Finally, the LED 60 will be energized, causing a three bit code corresponding to the bottom row of the array 10 to be generated. These three successive three bit codes are converted by the parallel to serial converter 18 into a nine bit code corresponding to the position at which the slider 34 is located.

Figure 6:
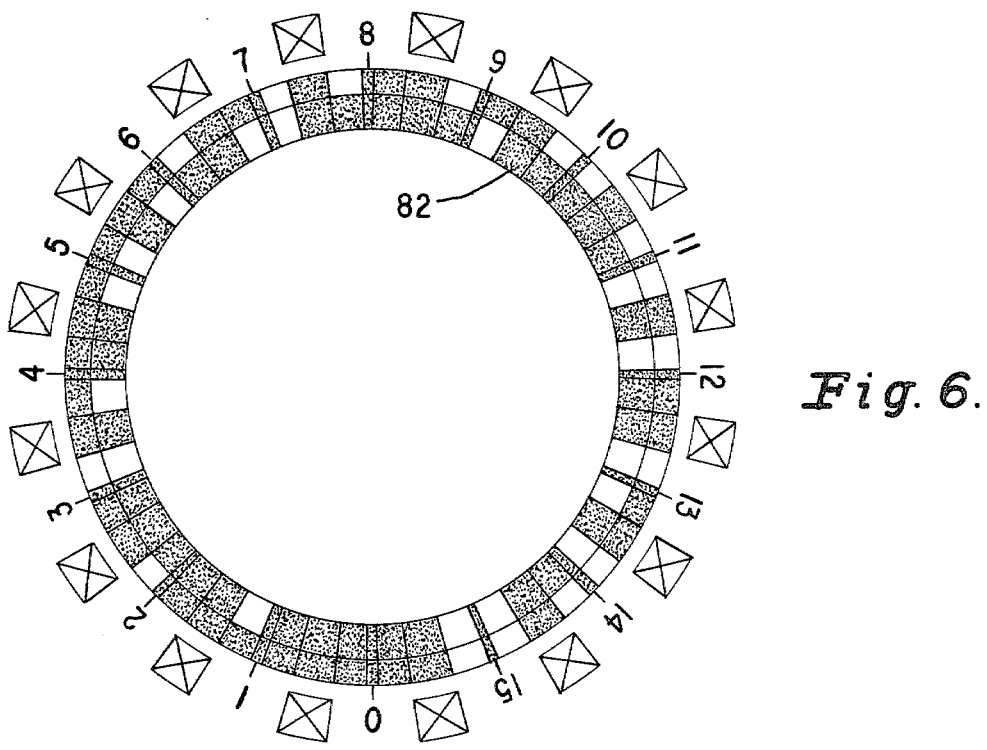
FIG. 6 illustrates a mask usable to provide an indication of angular position.

FIG. 6 illustrates a mask 82 which may be utilized as the skirt of a rotary switch, illustratively having sixteen positions, which is encoded in accordance with the principles of this invention and is adapted to be placed intermediate light emitters and receptors, as described above.

The construction of a device in accordance with the principles of this invention, as described above, is such that the number of discrete positions that can be encoded is equal to $2^{MN}$, where M equals the number of emitter fibers and N equals the number of receptor fibers. In essence, an arrangement constructed in accordance with the principles of this invention provides for transmission, by optical means, of a series of digital bytes of predetermined length in a bit parallel byte serial format, with the successive bytes later being assembled to form one or more longer digital words, or some other usable data format. This allows for a reduction in the number of light emitting and detecting elements.

Other constructions are contemplated as being within the scope of this invention. For example, the guide bar 30 does not have to be physically attached to the optoelectronics package 36. The slider 34 may be guided by means other than the guide bar 30. The optical fibers 38, 40 and 42 may be encoded in any binary format, including a reflected binary code. The LED's 56, 58 and 60 may be driven by any of several means, including a discrete wiring system having two leads per LED or through a matrix approach. The LED's 56, 58 and 60 may be housed either in the slider 34 or in the optoelectronics package 36.

Accordingly, there has been disclosed an improved position encoder. It is understood that the above-described embodiments are merely illustrative of the application of the principles of this invention. Numerous other embodiments may be devised by those skilled in the art without departing from the spirit and scope of this invention, as defined by the appended claims.

We claim:
1. A position encoder comprising:
a coding member defining a predetermined path and having coded indicia at a plurality of discrete positions along said path, the indicium at each of said positions comprising a rectangular array of code elements forming a first plurality of columns and a second plurality of rows;
a member movable relative to said coding member to any of said plurality of discrete positions;

interrogation means for sequentially scanning column by column the code elements at the position occupied by said movable member;

sensing means associated with the rows of the code element array and operative in synchronism with said interrogation means for providing in sequence parallel groups of encoding signals, each group corresponding to a column scan of said code elements by said interrogation means; and means for assembling a usable data format from the parallel groups of encoding signals.

2. The position encoder according to claim 1 wherein said coding member includes an optical mask, said interrogation means includes means for emitting light, and said sensing means includes light sensitive means responsive to the impingment of light thereon for providing an electrical signal.

3. The position encoder according to claim 2 wherein said coding member includes a plurality of optical fibers having selective areas thereon opaquely masked, each of said fibers corresponding to a row of said array and said interrogation means includes a plurality of optical fibers each corresponding to a column of said array and having a first end for receiving light and a second end for emitting light as a column covering all of said coding member fibers.

4. The position encoder according to claim 3 wherein said interrogation means includes a plurality of light emitting diodes each associated with one of said interrogation means optical fibers and each positioned at the first end of a respective fiber to transmit light therethrough when energized and said sensing means includes a plurality of photosensitive elements each associated with a respective coding member fiber.

* * * * *